(12) United States Patent
Lochtefeld et al.

(10) Patent No.: US 7,074,655 B2
(45) Date of Patent: *Jul. 11, 2006

(54) GATE MATERIAL FOR SEMICONDUCTOR DEVICE FABRICATION

(75) Inventors: Anthony J. Lochtefeld, Somerville, MA (US); Dimitri Antoniadis, Newton, MA (US); Matthew T. Currie, Brookline, MA (US)

(73) Assignee: AmberWave Systems Corporation, Salem, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/237,175

(22) Filed: Sep. 28, 2005

(65) Prior Publication Data

US 2006/0024869 A1 Feb. 2, 2006

Related U.S. Application Data

(63) Continuation of application No. 10/691,007, filed on Oct. 22, 2003.

(60) Provisional application No. 60/420,227, filed on Oct. 22, 2002.

(51) Int. Cl.
*H01L 21/00* (2006.01)
*H01L 27/01* (2006.01)

(52) U.S. Cl. ............ 438/149; 438/150; 438/198; 438/938; 257/347; 257/350; 257/351

(58) Field of Classification Search ........... 438/149, 438/150, 198, 933, 938; 257/190, 191, 192, 257/347, 350, 351
See application file for complete search history.

(56) References Cited

U.S. PATENT DOCUMENTS

| 5,227,644 | A | 7/1993 | Ueno |
| 6,268,253 | B1 | 7/2001 | Yu |
| 6,383,879 | B1 | 5/2002 | Kizilyalli et al. |
| 6,429,061 | B1 | 8/2002 | Rim |
| 2002/0076886 | A1 | 6/2002 | Rotondaro et al. |
| 2003/0227057 | A1 | 12/2003 | Lochtefeld et al. |
| 2004/0005740 | A1 | 1/2004 | Lochtefeld et al. |
| 2004/0031979 | A1 | 2/2004 | Lochtefeld et al. |
| 2004/0075105 | A1 | 4/2004 | Leitz et al. |
| 2004/0115916 | A1 | 6/2004 | Lochtefeld et al. |
| 2004/0137685 | A1* | 7/2004 | Lochtefeld et al. ......... 438/285 |

FOREIGN PATENT DOCUMENTS

EP 0 784 339 A2 7/1997
WO 01/93338 A1 12/2001

OTHER PUBLICATIONS

Imai et al. (May, 2002) "A 100nm Node CMOS Technology for System-on-a-Chip Applications". *IEICE Trans. Electron.*, vol. E85-C, No. 5, pp. 1057-1063.

(Continued)

*Primary Examiner*—Kevin M. Picardat
(74) *Attorney, Agent, or Firm*—Goodwin Procter LLP

(57) ABSTRACT

In forming an electronic device, a semiconductor layer is pre-doped and a dopant distribution anneal is performed prior to gate definition. Alternatively, the gate is formed from a metal. Subsequently formed shallow sources and drains, therefore, are not affected by the gate annealing step.

31 Claims, 10 Drawing Sheets

OTHER PUBLICATIONS

Park et al. (2002) "Gate Postdoping to Decouple Implant/Anneal for Gate, Source/Drain, and Extension: Maximizing Polysilicon Gate Activation for 0.1 μm CMOS Technologies", *2002 Symposium on VLSI Technology Digest of Technical Papers*, pp. 134-135.

Reinking et al. (Mar. 1999) "Fabrication of high-mobility Ge p-channel MOSFETs on Si substrates", *Electronics Letters*, vol. 35, No. 6, pp. 503-504.

Rim et al. (2002) "Characteristics and Device design of Sub-100 nm Strained SI N-and PMOSFETs", *2002 Symposium on VLSI Technology Digest of Technical Papers*, pp. 98-99.

Su et al. (2000) "Strained $Si_{1-x}Ge_x$ graded channel PMOSFET grown by UHVCVD", *Thin Solid Films, Elsevier Science*, vol. 369, No. 1-2, pp. 371-374.

Takagi et al. (Aug., 2001) "Strained-Si-on-Insulator (Strained-SOI) MOSFETs-Concept, Structures and Device Characteristics", IEICE Trans. Electron., vol. E84-C, No. 8, pp. 1043-1050.

Wyon (2002) "Future technology for advanced MOS devices", *Nuclear Instruments & Methods in Physics Research, Section-B:Beam Interactions With Materials and Atoms*, North-Holland Publishing Company, Amsterdam, NL, vol. 186, No. 1-4, pp. 380-391.

Xiang et al. (2000) "Very High Performance 40nm CMOS with Ultra-thin Nitride/Oxynitride Stack Gate Dielectric and Pre-doped Dual Poly-Si Gate Electrodes", *International Electron Devices Meeting 2000 IEDM Technical Digest*, pp. 860-862.

International Search Report for PCT/US03/33561, dated Mar. 24, 2004.

* cited by examiner

GATE MATERIAL FOR SEMICONDUCTOR DEVICE FABRICATION

RELATED APPLICATIONS

This application is a continuation of U.S. application Ser. No. 10/691,007, filed Oct. 22, 2003, which claims the benefit of U.S. Provisional Application 60/420,227 filed Oct. 22, 2002; the entire disclosures of both applications are hereby incorporated by reference.

FIELD OF THE INVENTION

This application relates generally to semiconductor devices and particularly to semiconductor structures made on semiconductor substrates with strained layers.

BACKGROUND

Formation of metal-oxide-semiconductor field-effect transistors (MOSFETs) requires the introduction of dopants into, e.g., a silicon (Si) substrate to define source and drain regions. Dopants are also introduced into a gate material, such as polycrystalline silicon (polysilicon), to achieve a desired conductivity. Dopants disposed in source, drain, and gate (S/D/G) regions are activated by a heat treatment to provide the needed electrical characteristics. For good-quality n-type MOS (NMOS) devices, dopant activation is typically performed at a high temperature, e.g., at least 1000° C. for 5 seconds, to avoid polysilicon depletion effects. A gate in which the polysilicon is depleted has a non-uniform distribution of dopants, with a relatively low concentration of dopants near an interface with a gate dielectric. This depletion region can result in reduced gate capacitance during device operation, resulting in a lower transistor drive current.

Activation of dopants in regions defined on substrates with strained layers, such as strained Si, presents a challenge. Strained Si substrates include a thin strained Si layer having a thickness of, e.g., 40–400 Å. The strained Si layer is disposed over a second material, e.g., a relaxed SiGe layer. A compressively strained SiGe layer may be disposed above or below the strained Si layer. These layer structures may make it difficult to maintain shallow source/drain junctions in, for example, complementary MOS (CMOS) devices, especially when the strained Si/SiGe substrate is subjected to high temperatures. This difficulty arises from the different diffusion rates of dopants in SiGe and in Si. For example, arsenic (As) may diffuse much more rapidly in SiGe than in Si at temperatures significantly above 900° C. and/or times significantly above 30 seconds. This rapid diffusion leads to deeper source/drain junctions in NMOS transistors fabricated on strained-Si/SiGe substrates and/or excessive lateral diffusion of dopants beneath the gate, i.e., into the channel region. Because of the diffusion of As into a channel of the NMOS transistor, the transistor has a high off current ($I_{off}$) and it becomes more difficult to turn off.

In alternative structures, the second material over which the strained layer is disposed may be e.g., a bulk semiconductor substrate, or an insulating material. Here, too, it may be difficult to maintain shallow source/drain junctions or prevent excessive lateral diffusion of dopants, especially when the strained structures are subjected to high temperatures. This difficulty arises from the different diffusion rates of dopants in strained layers in comparison to bulk, non-strained materials. For example, boron diffuses faster through strained Si than through bulk Si.

A possible solution is to perform the S/D/G dopant activation at a restricted time and temperature (e.g., 900° C. for 30 sec). However, these restricted parameters may lead to unacceptable polysilicon depletion effects.

SUMMARY

A semiconductor layer is pre-doped and a dopant distribution anneal is performed prior to gate definition. Subsequently formed shallow sources and drains, therefore, are not affected by the gate annealing step.

In an aspect, the invention features a method for forming a structure, the method including forming a layer over a substrate, the layer having a depletion region with a thickness less than approximately 20 angstroms. A portion of the layer is removed to define a gate of a transistor, the gate defining a channel length. A plurality of dopants are introduced into the substrate proximate the gate to define a source and a drain, and the substrate is heated to a temperature to activate the plurality of dopants. The temperature is sufficiently low to prevent at least a portion of the plurality of dopants from diffusing enough to induce a high off current.

One or more of the following features may be included. The substrate may include an insulating layer. A strained layer may be disposed over the insulating layer. The substrate may include a strained layer. The strained layer may be tensilely strained or compressively strained. The substrate may include a relaxed layer. The substrate may include germanium. The depletion region thickness may be less than 10 angstroms.

The induced off current may be less than $10^{-6}$ Amperes per micrometer, and preferably may be less than $10^{-9}$ Amperes per micrometer.

After the plurality of dopants are introduced, a portion of the plurality of dopants disposed in a region of the source may define a source extent proximate the channel, and after heating the substrate, the source extent may diffuses under the gate a distance extending less than 12.5% of the channel length. A concentration of the portion of dopants at the source extent may be at least approximately $10^{18}$ atoms/cubic centimeter.

After the plurality of dopants are introduced, a portion of the plurality of dopants disposed in a region of the drain may define a drain extent proximate the channel, and after heating the substrate, the drain extent may diffuse under the gate a distance extending less than 12.5% of the channel length. A concentration of the portion of dopants at the drain extent may be at least approximately $10^{18}$ atoms/cubic centimeter.

The layer may include a semiconductor and the step of forming the layer may include introducing a plurality of gate dopants into the layer, and heating the layer to a first temperature to alter a distribution of the gate dopants in the layer. The semiconductor may include silicon and/or germanium.

The layer may include a metallic element, such as at least one of molybdenum, titanium, tantalum, tungsten, iridium, nickel, cobalt, and platinum.

In another aspect, the invention features a method for forming a structure, the method including introducing a first plurality of dopants into a gate electrode layer disposed over a substrate. The gate electrode layer is heated to a first temperature to alter a distribution of the first plurality of dopants in the gate electrode layer. A portion of the gate electrode layer is removed to define a gate of a transistor. A second plurality of dopants is introduced into the substrate proximate the gate to define a source and a drain. The substrate is heated to a second temperature to activate the second plurality of dopants, with second temperature being less than the first temperature.

One or more of the following features may be included. The substrate may include an insulating layer. The substrate may include a strained layer disposed over the insulating layer.

The substrate may include a strained layer. The strained layer may be tensilely strained or compressively strained. The substrate may include a relaxed layer. The substrate may include germanium.

The first temperature may be greater than 1000° C. The second temperature may be less than 1000° C.

The gate electrode layer may include a semiconductor layer, such as silicon and/or germanium.

The first plurality and the second plurality of dopants may include n-type dopants and/or or p-type dopants.

In another aspect, the invention features a method for forming a structure, the method including introducing a first plurality of dopants into a gate electrode layer disposed over a substrate. The semiconductor layer is heated for a first time period to alter a distribution of the first plurality of dopants in the gate electrode layer. A portion of the gate electrode layer is removed to define a gate of a transistor. A second plurality of dopants is introduced into the substrate proximate the gate to define a source and a drain. The substrate is heated for a second time period to activate the second plurality of dopants, with the second time period having a shorter duration than a duration of the first time period.

One or more of the following features may be included. The substrate may include an insulating layer. The substrate may include a strained layer disposed over the insulating layer. The substrate may include a strained layer. The strained layer may be tensilely strained or compressively strained. The substrate may include a relaxed layer. The substrate may include at least one of silicon and germanium.

The first time period may be greater than 5 seconds. In some embodiments, the first time period may be greater than 30 seconds.

The gate electrode layer may include a semiconductor layer. The semiconductor layer may include silicon and/or germanium.

The first and the second plurality of dopants may include n-type dopants and/or p-type dopants.

In another aspect, the invention features a structure including a strained layer disposed over a substrate. A first transistor includes a first source and a first drain, with at least a portion of the first source and the first drain disposed in a first portion of the strained layer. The first gate is disposed above the strained layer and between the source and drain regions, the first gate including a first metal. A first gate dielectric layer is disposed between the first gate and the strained layer.

One or more of the following features may be included. The substrate may include dielectric material and the strained layer may be disposed in contact with the dielectric material. The first metal may be selected from the group consisting of titanium, tungsten, molybdenum, tantalum, nickel, cobalt, and platinum. The strained layer may include silicon and/or germanium. The gate may include a metal-semiconductor alloy. In some embodiments, the gate may include only metal silicide.

A channel may be disposed under the gate. The source may include a source extent proximate the channel, the source extent extending under the gate a distance less than 12.5% of a channel length. A concentration of dopants in the source extent may be at least approximately $10^{18}$ atoms/cubic centimeter. The drain may include a drain extent proximate the channel, the drain extent extending under the gate a distance less than 12.5% of a channel length. A concentration of dopants in the drain extent may be at least approximately $10^{18}$ atoms/cubic centimeter.

The structure may have a second transistor that includes a second source and a second drain, with at least a portion of the first source and the first drain disposed in a second portion of the strained layer. A second gate may be disposed above the strained layer and between the second source and second drain regions, the second gate including a second metal. A second gate dielectric layer may be disposed between the second gate and the strained layer. The first transistor may be an n-type metal-oxide semiconductor field-effect transistor, the first source and the first drain may include n-type dopants, the second transistor may be a p-type metal-oxide-semiconductor field-effect transistor, and the second source and second drain may include p-type dopants.

The first gate may have a first workfunction, the second gate may have a second workfunction, and the first workfunction may be substantially equal to or substantially different from the second workfunction.

BRIEF DESCRIPTION OF THE DRAWINGS

FIGS. 5–8A are a series of schematic cross-sectional views of a semiconductor substrate illustrating a process for fabricating a semiconductor structure on the substrate;

Like-referenced features represent common features in corresponding drawings.

DETAILED DESCRIPTION

Figure 1:
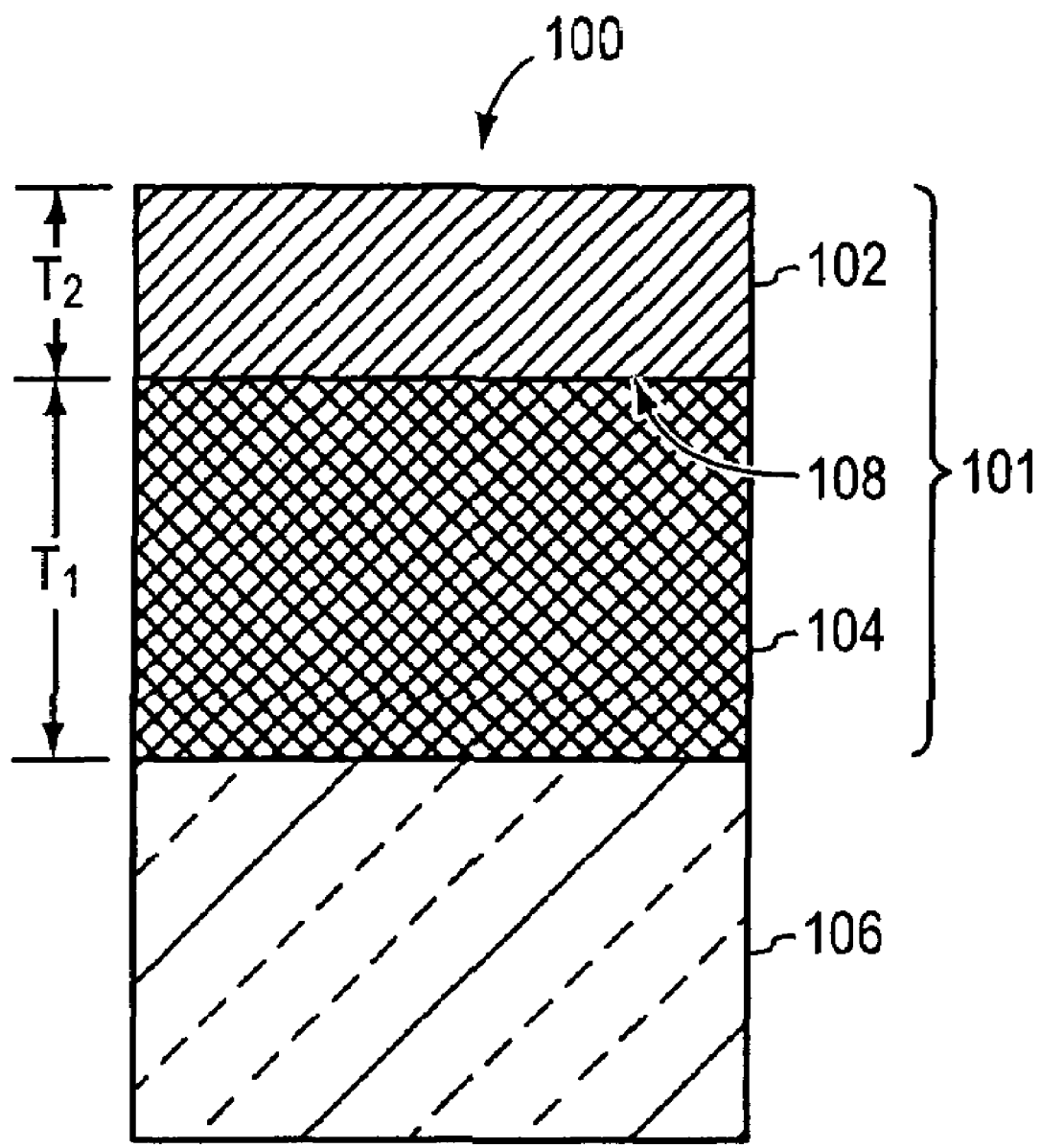
FIGS. 1–4 illustrate several substrates amenable for use fabrication of semiconductor structures.

Referring to FIG. 1, which illustrates an epitaxial wafer 100 amenable to use with the present invention, several layers collectively indicated at 101, including a strained layer 102 and a relaxed layer 104, are disposed over a substrate 106. The ensuing discussion focuses on a strained layer 102 that is tensilely strained, but it is understood that strained layer 102 may be tensilely or compressively strained. Strained layer 102 has a lattice constant other than the equilibrium lattice constant of the material from which it is formed, and it may be tensilely or compressively strained; relaxed layer 104 has a lattice constant equal to the equilibrium lattice constant of the material from which it is formed. Tensilely strained layer 102 shares an interface 108 with relaxed layer 104.

Substrate 106 and relaxed layer 104 may be formed from various materials systems, including various combinations of group II, group III, group IV, group V, and group VI elements. For example, each of substrate 106 and relaxed layer 104 may include a III–V compound. Substrate 106 may include gallium arsenide (GaAs), and relaxed layer 104 may include indium gallium arsenide (InGaAs) or aluminum gallium arsenide (AlGaAs). These examples are merely illustrative, and many other material systems are suitable.

In an embodiment, relaxed layer 104 may include $Si_{1-x}Ge_x$ with a uniform composition, containing, for example, Ge in the range $0.1 \leq x \leq 0.9$ and having a thickness $T_1$ of, e.g., 0.2–2 μm. In an embodiment, $T_1$ is 1.5 μm.

Strained layer 102 may include a semiconductor such as at least one of a group II, a group III, a group IV, a group V, and a group VI element. Strained semiconductor layer 102 may include, for example, Si, Ge, SiGe, GaAs, indium phosphide (InP), and/or zinc selenide (ZnSe). In some embodiments, strained semiconductor layer 102 may include approximately 100% Ge, and may be compressively strained. A strained semiconductor layer 102 comprising 100% Ge may be formed over, e.g., relaxed layer 104 containing uniform $Si_{1-x}Ge_x$ having a Ge content of, for example, 50–90% (i.e., x=0.5–0.9), preferably 70% (i.e., x=0.7).

In an embodiment, tensilely strained layer 102 is formed of silicon. Tensilely strained layer 102 has a thickness $T_2$ of, for example, 50–1000 Å. In an embodiment, thickness $T_2$ is less than 200 Å.

Relaxed layer 104 and strained layer 102 may be formed by epitaxy, such as by atmospheric-pressure CVD (APCVD), low- (or reduced-) pressure CVD (LPCVD), ultra-high-vacuum CVD (UHVCVD), by molecular beam epitaxy (MBE), or by atomic layer deposition (ALD). Strained layer 102 containing Si may be formed by CVD with precursors such as silane, disilane, or trisilane. Strained layer 102 containing Ge may be formed by CVD with precursors such as germane or digermane. The epitaxial growth system may be a single-wafer or multiple-wafer batch reactor. The growth system may also utilize a low-energy plasma to enhance layer growth kinetics.

In an embodiment in which strained layer 102 contains substantially 100% Si, strained layer 102 may be formed in a dedicated chamber of a deposition tool that is not exposed to Ge source gases, thereby avoiding cross-contamination and improving the quality of interface 108 between strained layer 102 and relaxed layer 104. Furthermore, strained layer 102 may be formed from an isotopically pure silicon precursor(s). Isotopically pure Si has better thermal conductivity than conventional Si. Higher thermal conductivity may help dissipate heat from devices subsequently formed on strained layer 102, thereby maintaining the enhanced carrier mobilities provided by strained layer 102.

In some embodiments, relaxed layer 104 and/or strained layer 102 may be planarized by, e.g., CMP, to improve the quality of subsequent wafer bonding. Strained layer 102 may have a low surface roughness, e.g., less than 0.5 nanometer (nm) root mean square (RMS).

Figure 2:
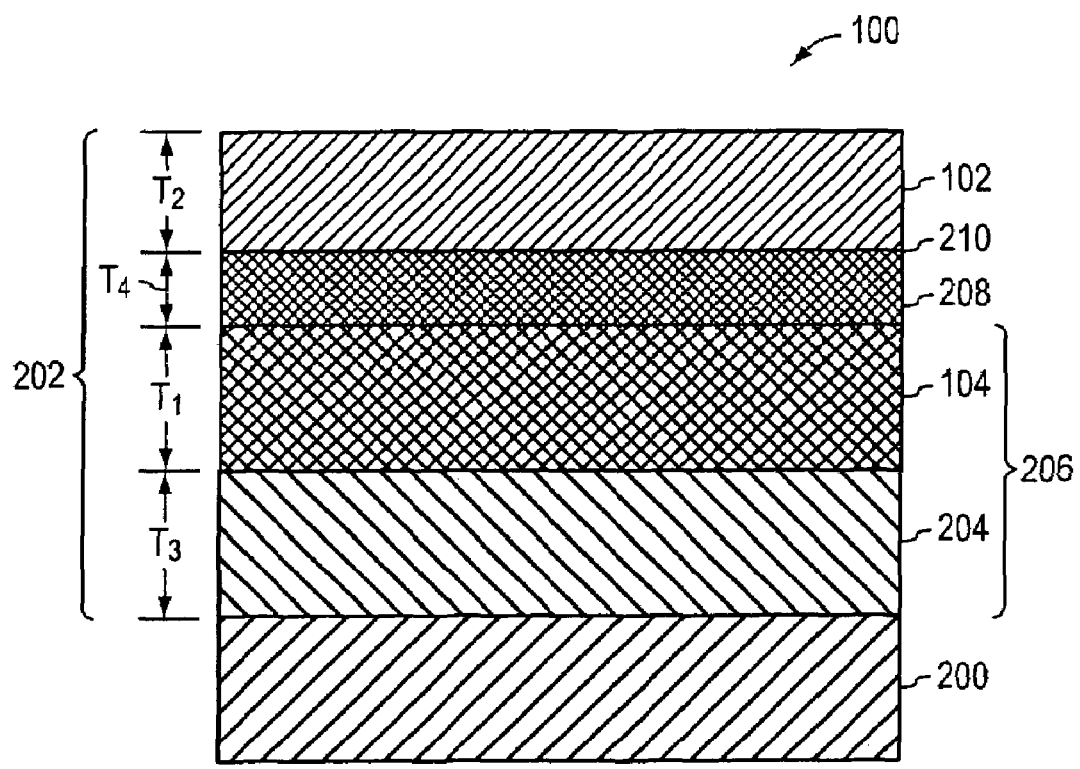

Referring to FIG. 2, an alternative epitaxial wafer 100 amenable for use with the present invention may include layers in addition to those indicated in FIG. 1. For example, a substrate 200 formed from a semiconductor, such as silicon, may have several layers collectively indicated at 202 formed upon it. Layers 202 may be grown, for example, by APCVD, LPCVD, or UHVCVD.

Layers 202 include a graded layer 204 disposed over substrate 200. Graded layer 204 may include Si and Ge with a grading rate of, for example, 10% Ge per μm of thickness, and a thickness $T_3$ of, for example, 2–9 μm. Graded layer 204 may be grown, for example, at 600–1200° C. See, e.g., U.S. Pat. No. 5,221,413, incorporated herein by reference in its entirety. Relaxed layer 104 is disposed over graded layer 204. A virtual substrate 206 includes relaxed layer 104 and graded layer 204.

A compressively strained layer 208 including a semiconductor material is disposed over relaxed layer 104. In an embodiment, compressively strained layer 208 includes group IV elements, such as $Si_{1-y}Ge_y$, with a Ge content (y) higher than the Ge content (x) of relaxed $Si_{1-x}Ge_x$ layer 104. Compressively strained layer 208 contains, for example, Ge in the range $0.25 \leq y \leq 1$ and has a thickness $T_4$ of, e.g., 10–500 angstroms (Å). In some embodiments, compressively strained layer 208 has a thickness $T_4$ of less than 500 Å. In certain embodiments, $T_4$ is less than 200 Å.

Tensilely strained layer 102 is disposed over compressively strained layer 208, sharing an interface 210 with compressively strained layer 208. In some embodiments, compressively strained layer 208 may be disposed not under, but over tensilely strained layer 102.

Substrate 200 with layers 202 typically has a threading dislocation density of $10^{4-10^5}/cm^2$.

Figure 3:
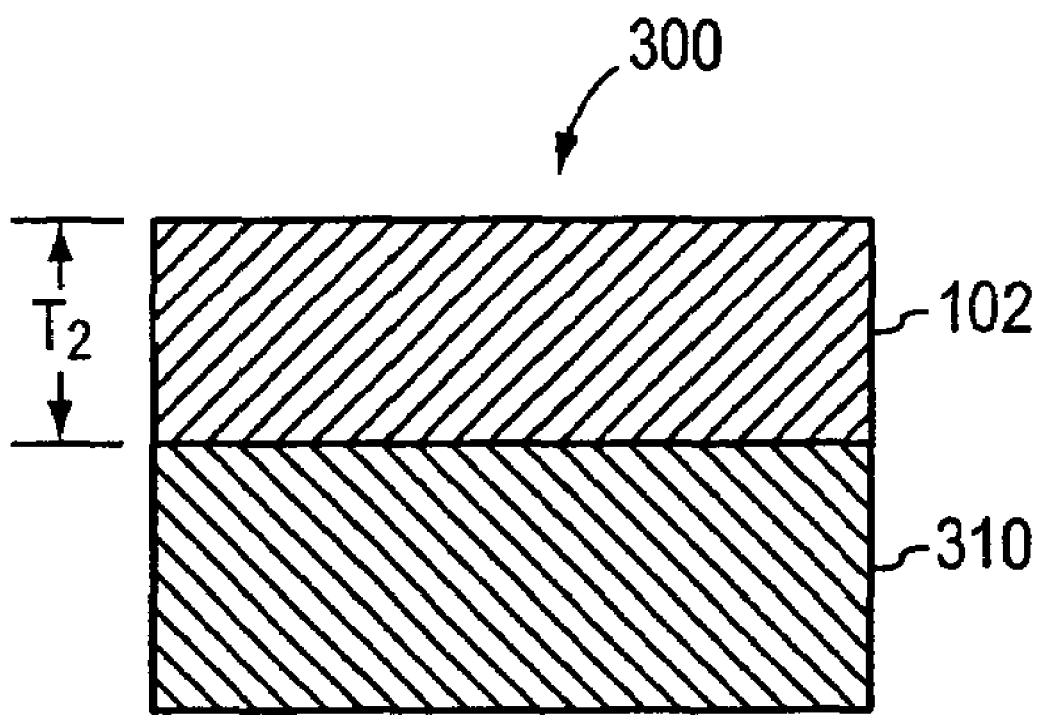

Referring to FIG. 3, yet another alternative epitaxial wafer amenable for use with the present invention is a strained-semiconductor-on-semiconductor SSOS substrate 300, having a strained layer 102 disposed in contact with a crystalline semiconductor handle wafer 310. Handle wafer 310 may include a bulk semiconductor material, such as silicon. The strain of strained layer 102 is not induced by underlying handle wafer 310, and is independent of any lattice mismatch between strained layer 102 and handle wafer 310. In an embodiment, strained layer 102 and handle wafer 310 include the same semiconductor material, e.g., silicon. Handle wafer 310 may have a lattice constant equal to a lattice constant of strained layer 102 in the absence of strain. Strained layer 102 may have a strain greater than approximately $10^{-3}$. Strained layer 102 may have been formed by epitaxy, and may have a thickness $T_2$ ranging from approximately 20 Å to approximately 1000 Å, with a thickness uniformity of better than approximately ±10%. In an embodiment, strained layer 102 may have a thickness uniformity of better than approximately ±5%. Strained layer 102 may have a surface roughness of less than 20 Å.

The SSOS substrate 300 may be formed, as described in U.S. Ser. Nos. 10/456,708, 10/456,103, 10/264,935, and 10/629,498, the entire disclosures of each of the four applications being incorporated herein by reference. The SSOS substrate formation process may include the formation of strained layer 102 over substrate 106 as described above with reference to FIG. 1. A cleave plane may be defined in, e.g., relaxed layer 104. Strained layer 102 may be bonded to the handle wafer 310, and a split may be induced at the cleave plane. Portions of the relaxed layer 104 remaining on strained layer 102 may be removed by, e.g., oxidation and/or wet etching.

Figure 4:
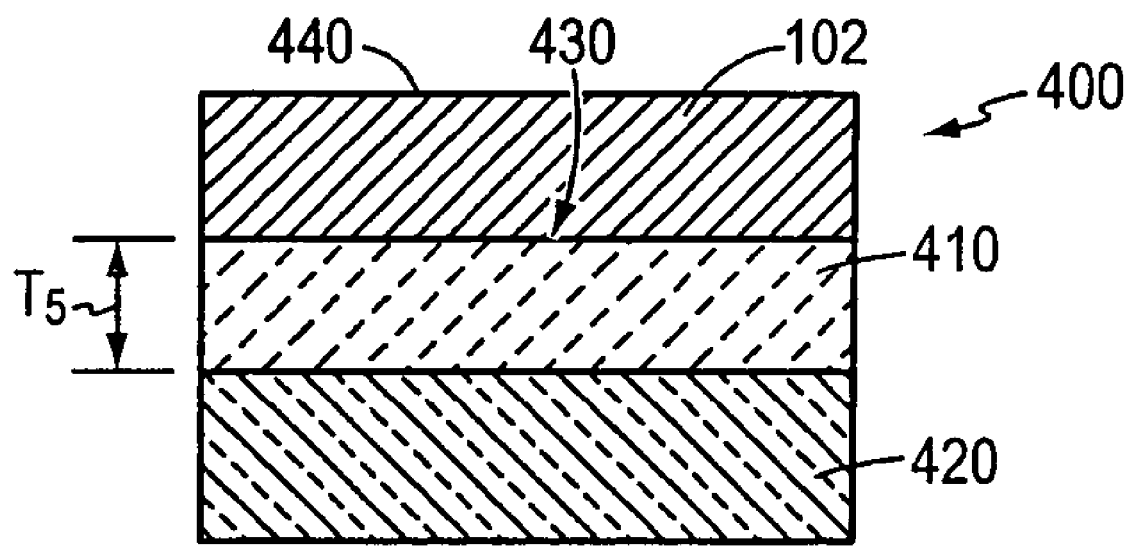

Yet another epitaxial wafer amenable for use with the present invention is a strained-semiconductor-on-insulator (SSOI) wafer 400. Referring to FIG. 4, a SSOI wafer 400 has strained layer 102 disposed over an insulator, such as a dielectric layer 410 formed on a semiconductor substrate 420. SSOI substrate 400 may be formed by methods analogous to the methods described above in the formation of SSOS substrate 300. Dielectric layer 410 may include, for example, $SiO_2$. In an embodiment, dielectric layer 410 includes a material having a melting point ($T_m$) higher than a $T_m$ of pure $SiO_2$, i.e., higher than 1700° C. Examples of such materials are silicon nitride ($Si_3N_4$), aluminum oxide, magnesium oxide, etc. In another embodiment, dielectric layer 410 includes a high-k material with a dielectric constant higher than that of $SiO_2$, such as aluminum oxide ($Al_2O_3$), hafnium oxide ($HfO_2$) or hafnium silicate (HfSiON or $HfSiO_4$). Semiconductor substrate 420 includes a semiconductor material such as, for example, Si, Ge, or SiGe. Strained layer 102 has a thickness $T_4$ selected from a range of, for example, 50–1000 Å, with a thickness uniformity of better than approximately +5% and a surface roughness of less than approximately 20 Å. Dielectric layer 410 has a thickness $T_5$ selected from a range of, for example, 500–3000 Å. In an embodiment, strained layer 102 includes approximately 100% Si or 100% Ge having one or more of the following material characteristics: misfit dislocation density of, e.g., 0–$10^5$ cm/$cm^2$; a threading dislocation density of about $10^1$–$10^7$ dislocations/$cm^2$; a surface roughness of approximately 0.01–1 nm RMS; and a thickness uniformity across SSOI substrate 400 of better than approximately ±10% of a mean desired thickness; and a thickness $T_4$ of less than approximately 200 Å. In an embodiment, SSOI substrate 400 has a thickness uniformity of better than approximately ±5% of a mean desired thickness.

In an embodiment, dielectric layer 410 has a $T_m$ greater than that of $SiO_2$. During subsequent processing, e.g., MOSFET formation, SSOI substrate 400 may be subjected to high temperatures, i.e., up to 1100° C. High temperatures may result in the relaxation of strained layer 102 at an interface 430 between strained layer 102 and dielectric layer 410. The use of dielectric layer with a $T_m$ greater than 1700° C. may help keep strained layer 102 from relaxing at the interface 430 between strained layer 102 and dielectric layer 410 when SSOI substrate is subjected to high temperatures.

In an embodiment, the misfit dislocation density of strained layer 102 may be lower than its initial dislocation density. The initial dislocation density may be lowered by, for example, performing an etch of a top surface 440 of strained layer 102. This etch may be a wet etch, such as a standard microelectronics clean step such as an RCA SC1, i.e., hydrogen peroxide, ammonium hydroxide, and water ($H_2O_2$+$NH_4OH$+$H_2O$), which at, e.g., 80° C. may remove silicon.

In an embodiment, substrate 210 with layers 202 is processed through various CMOS front-end steps such as well definition and isolation formation (not shown).

Figure 5:
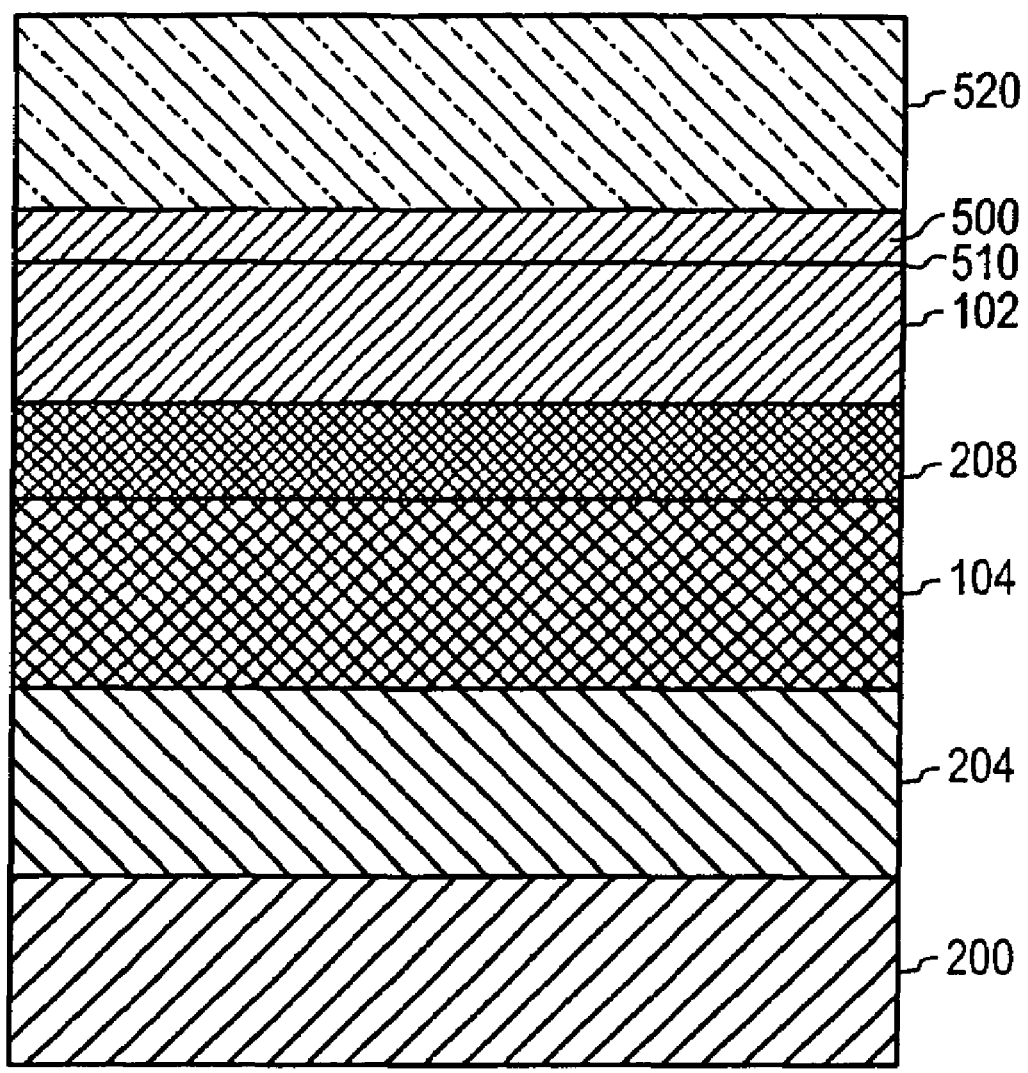

Referring to FIG. 5, a gate dielectric layer 500 is formed on a top surface 510 of strained layer 102. Gate dielectric layer 500 is, for example, a thermally grown gate oxide such as silicon dioxide ($SiO_2$). Alternatively, gate dielectric layer 500 may include a high-k material with a dielectric constant higher than that of $SiO_2$, such as aluminum oxide ($Al_2O_3$), hafnium oxide ($HfO_2$) or hafnium silicate (HfSiON or $HfSiO_4$). In some embodiments, gate dielectric layer 500 may be a stacked structure, e.g., a thin $SiO_2$ layer capped with a high-k material. A gate electrode layer 520 is formed over gate dielectric layer 500. Gate electrode layer 520 may include, for example, polysilicon, amorphous silicon, Ge, or SiGe gate material.

Figure 6:
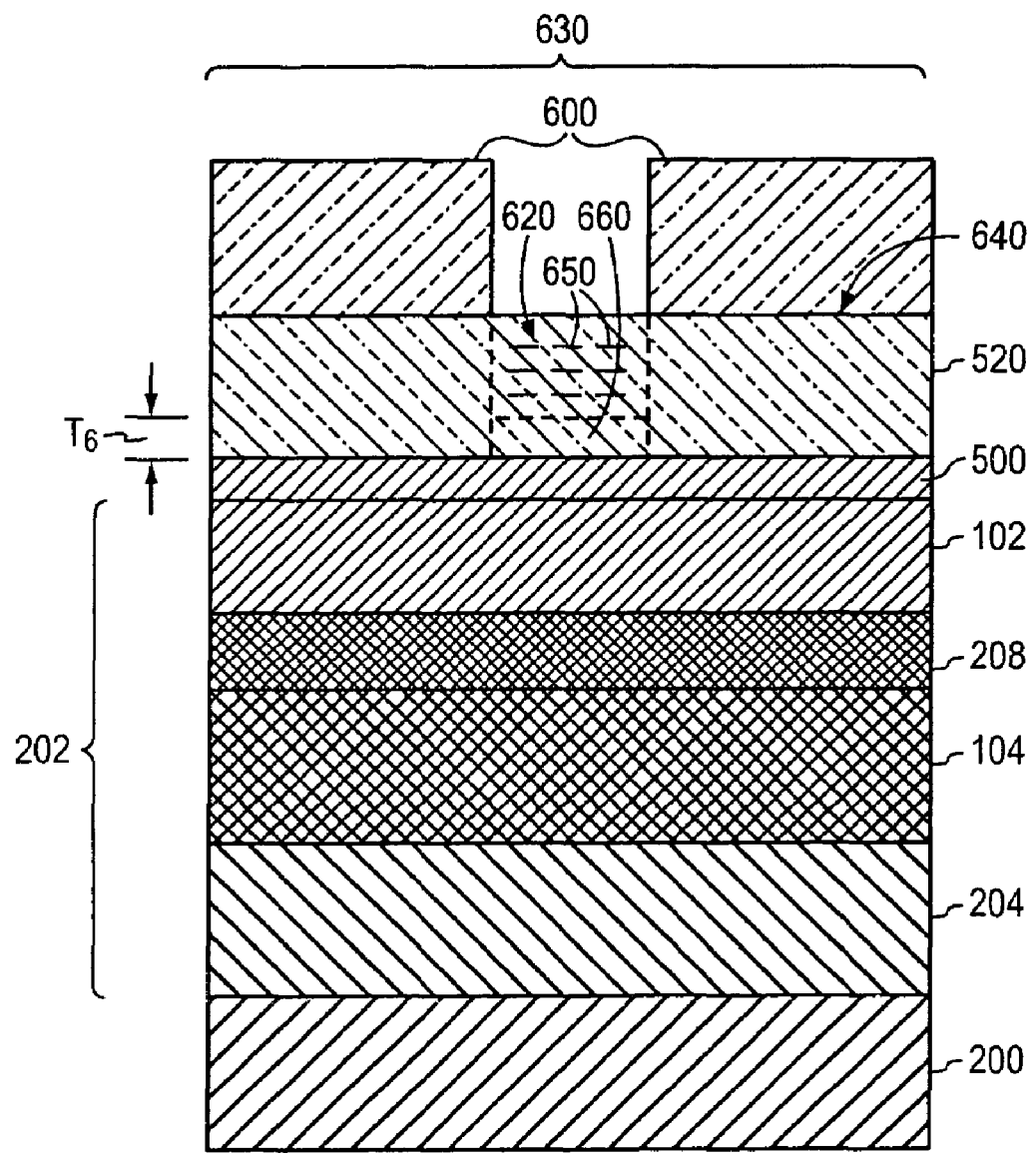

Referring to FIG. 6, an implantation mask 600 is formed over gate electrode layer 520. Implantation mask 600 may be made of a masking material such as photoresist. Implantation mask 600 defines an opening 610, with opening 610 exposing a portion 620 of gate electrode layer 520 (defined for purposes of illustration by the dashed lines). Gate electrode layer portion 620 is disposed over a portion of region 630 of substrate 200 and layers 202 in which NMOS devices will be formed. Implantation mask 600 protects portions of the top surface 640 of gate electrode layer 520 disposed over regions of substrate 200 and layers 202 in which NMOS devices will not be formed. In the illustrated embodiment, implantation mask exposes only an area 620 in which an NMOS gate will be defined (see below). In some other embodiments, implantation mask 600 exposes entire regions of gate electrode layer 520 disposed over regions of substrate 200 and layers 202 in which NMOS devices will be formed, including regions in which n-type sources and drains will be formed (see below).

Subsequent to the formation of implantation mask 600, a plurality of n-type dopants 650 are introduced into gate electrode layer portion 620 through opening 610. N-type dopants 650 may be, for example, As or phosphorus (P) ions introduced by ion implantation. After the implantation of n-type dopants, implantation mask 600 is removed by a stripping process such as a dry strip in an oxygen plasma. A diffusion anneal is performed to diffuse n-type dopants 650 uniformly in a vertical direction throughout portion 620 of gate electrode layer 520. This diffusion anneal is performed at a relatively high temperature, e.g., over 1000° C., such as 1025° C., for a sufficiently long time to uniformly diffuse dopants 650, e.g., 5 seconds or more. The diffusion anneal results in the formation of a depletion region 660 in portion 620 of gate electrode layer 520 having a thickness $T_6$ of, e.g., less than 20 angstroms, preferably less than 10 angstroms.

Figure 7:
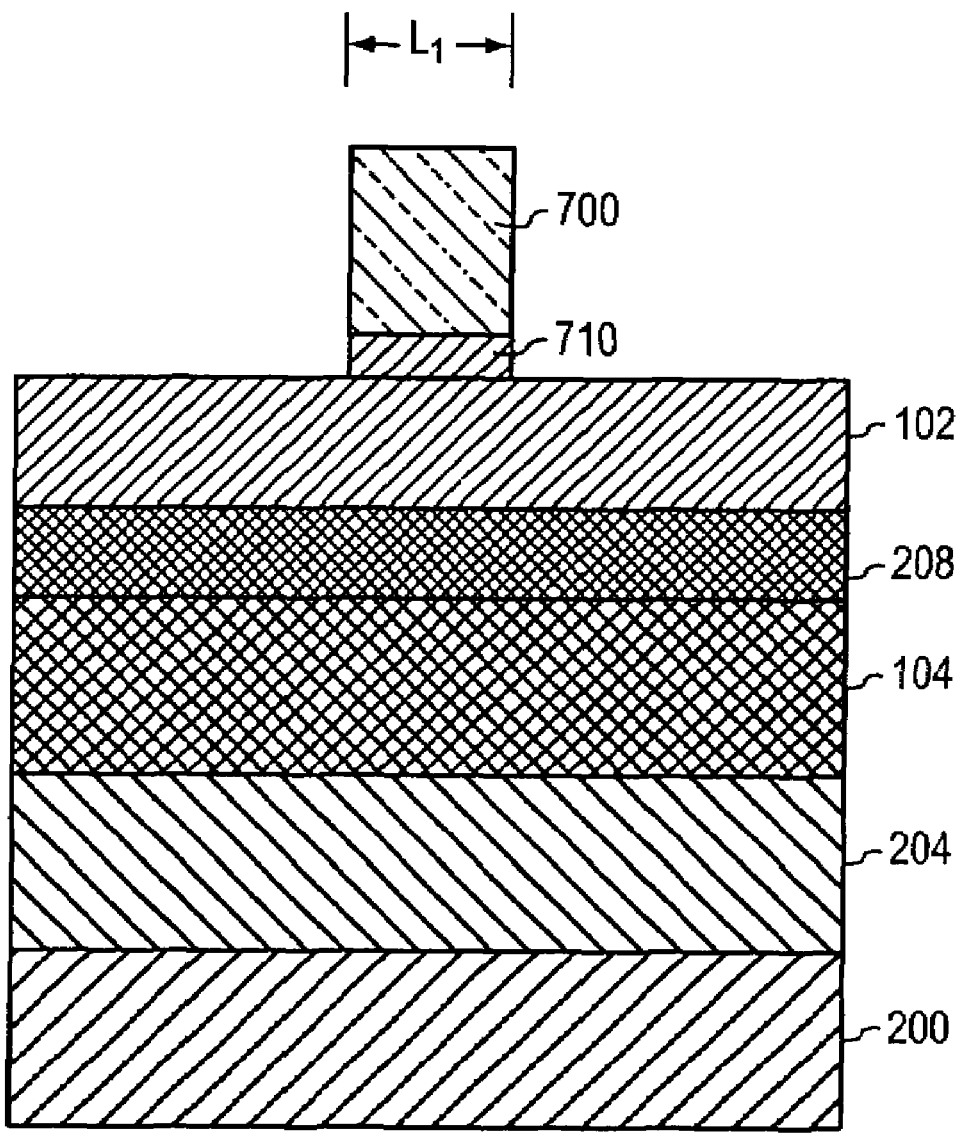

Referring to FIG. 7, as well as to FIG. 6, a gate 700 formed from gate electrode layer 520 is defined as follows. A gate photoresist mask (not shown) is deposited and patterned to protect at least part of portion 620 of gate electrode layer 520. Regions of gate electrode layer 520, as well as regions of portion 620, exposed by the gate photoresist mask are removed by a removal process such as reactive ion etching (RIE). Subsequently, portions of dielectric layer 500 exposed by the RIE of portions of gate electrode layer 520 are also removed by a removal step, such as RIE with an etch chemistry selective to the material comprising strained layer 102, such as Si. Removal of portions of dielectric layer 500 exposes top surface 510 of strained layer 102, and defines a gate dielectric 710 disposed under gate 700. The gate photoresist mask is removed by, for example, a stripping process such as a dry strip in an oxygen plasma. Gate 700 includes a uniform distribution of n-type dopants, and defines an initial channel length $L_1$.

Figure 8B:
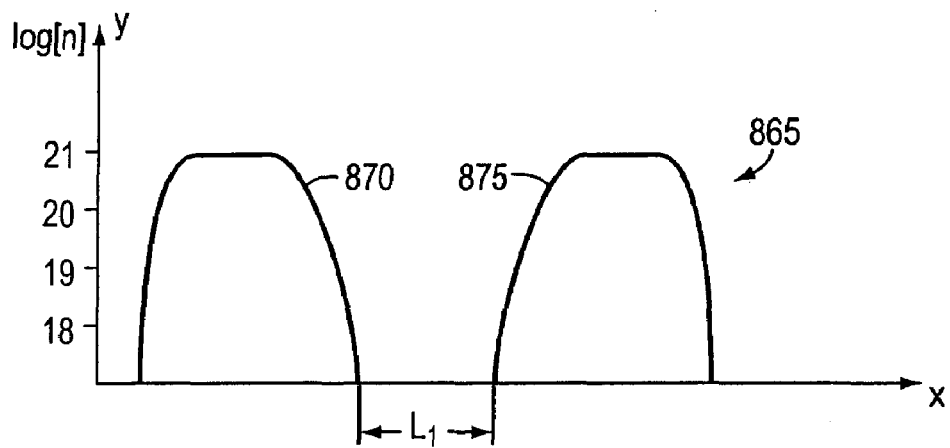
FIG. 8B graphically depicts a distribution of dopants in the semiconductor structure illustrated in FIG. 8A.
Figure 8A:
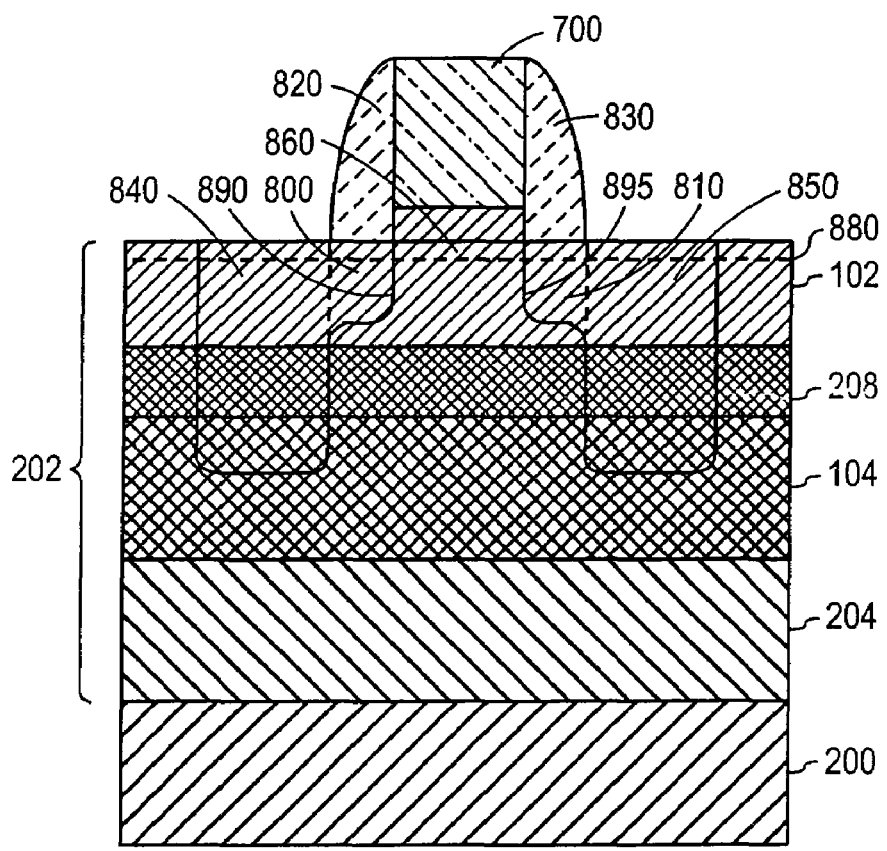

Referring to FIG. 8A, a shallow implantation of n-type dopants, such as As, is performed to define a source extension 800 and a drain extension 810 in strained layer 102. A first sidewall spacer 820 and a second sidewall spacer 830 are defined proximate gate 700. First and second sidewall spacers 820, 830 are formed from a dielectric, such as silicon dioxide or silicon nitride. A source 840 and a drain 850 may be defined in portions of strained layer 102, compressively strained layer 208, and relaxed layer 104, proximate first and second sidewall spacers 820, 830. In some embodiments, source 840 and drain 850 may be defined in strained layer 102. Source 840 and drain 850 are defined by the introduction of a plurality of dopants, such as by an implantation of n-type dopants, e.g., As, into layers 202 disposed over substrate 200. These dopants are substantially prevented from reaching regions of compressively strained layer 208 and strained layer 102 disposed below gate dielectric 710 by the presence of sidewall spacers 820, 830.

After the introduction of dopants to define source 840, drain 850, source extension 800, and drain extension 810, an activation anneal is performed to activate these dopants. The activation anneal is performed at a relatively low temperature, e.g., less than 1000° C. For example, an activation anneal may be done at 900° C. for 30 seconds. Alternatively, the activation anneal may be done for a very short duration at a higher temperature, e.g., 1 second at 1100° C. In an alternative embodiment, an activation anneal of extremely short duration (e.g., less than 1 second) may be performed by techniques such as flash lamp annealing or laser annealing at temperatures between 900° C. and 1350° C. This temperature and time are sufficient to activate the dopants in the source 840 and drain 850, without inducing excessive diffusion of n-type dopants into a channel 860 under gate 700. As a result of this procedure, good dopant activation is achieved and polysilicon depletion avoided due to the high-temperature diffusion anneal. At the same time, dopants in the vicinity of strained layer 102 and/or compressively strained layer 208 do not experience high temperatures for long durations (high thermal budgets) and, hence, do not significantly invade these layers beyond the boundaries of source 840, drain 850, source extension 800, and drain extension 810. Dopants do not diffuse into channel 860 enough to induce a high off current. The off current may be less than $10^{-6}$ Amperes per micrometer. In some embodiments, the off current is less than $10^{-9}$ Amperes per micrometer.

Referring to FIG. 8B as well as to FIG. 8A, a concentration of dopants in layers 202 may be graphically depicted with a graph 865, with an x-axis representing positions within strained layer 102 and a y-axis representing a logarithm of dopant concentration. A concentration [n] 870 of dopants in source 840 and source extension 800 and a concentration [n] 875 of dopants in drain 850 and drain extension 810 may have a maximum level of approximately $10^{21}$ atoms/cubic centimeter at a level 880 disposed below a surface of strained layer 102. Dopants disposed in an outer region of source 840 may define a source extent 890, and dopants disposed in an outer region of drain 850 may define a drain extent 895. The concentration of dopants at source extent 76 and drain extent 78 may be approximately $10^{18}$ atoms/cubic centimeter. After heating of substrate 200, portions of source extent 890 and drain extent 895 disposed proximate channel 860 may diffuse a distance extending less than 12.5% of gate length $L_1$, thereby decreasing channel length $L_1$ by no more than 25%. The abruptness of the dopant concentration in the source and drain region may also be greater than 2 nm per decade (i.e., per order of magnitude in concentration). In some embodiments, this abruptness may be better than 4 nm/decade.

In an alternative embodiment, PMOS devices are formed with pre-doped gates. Here, the semiconductor material from which the PMOS gate will be defined is doped with p-type dopants (e.g. boron or indium) prior to PMOS gate definition.

In some embodiments, source and drain extensions may extend into an underlying layer that may include an element other than Si, such as Ge.

In an alternative embodiment, no mask, e.g., no implantation mask 600, is formed before gate electrode layer 520 is implanted with n-type dopants. In some applications, however, implantation of n-type dopants into gate electrode layer 520 material which will be used for PMOS gates (or vice versa) may adversely affect threshold voltages.

In some embodiments, gate 700 is formed from a conductive material that does not require doping, such as a metal. Gate 700 can be formed from metals such as titanium (Ti), tungsten (W), molybdenum (Mo), or tantalum (Ta), as well as other materials, e.g., titanium nitride (TiN), titanium silicon nitride (TiSiN), tungsten nitride (WN), tantalum nitride (TaN), tantalum silicide (TaSi), iridium (Ir), iridium oxide ($IrO_2$), etc., that provide an appropriate workfunction, i.e., a workfunction of approximately 4–5.5 electron volts (eV), without doping. Metal gates may have a depletion region of 20 angstroms or less, preferably less than 10 angstroms.

Figure 9:
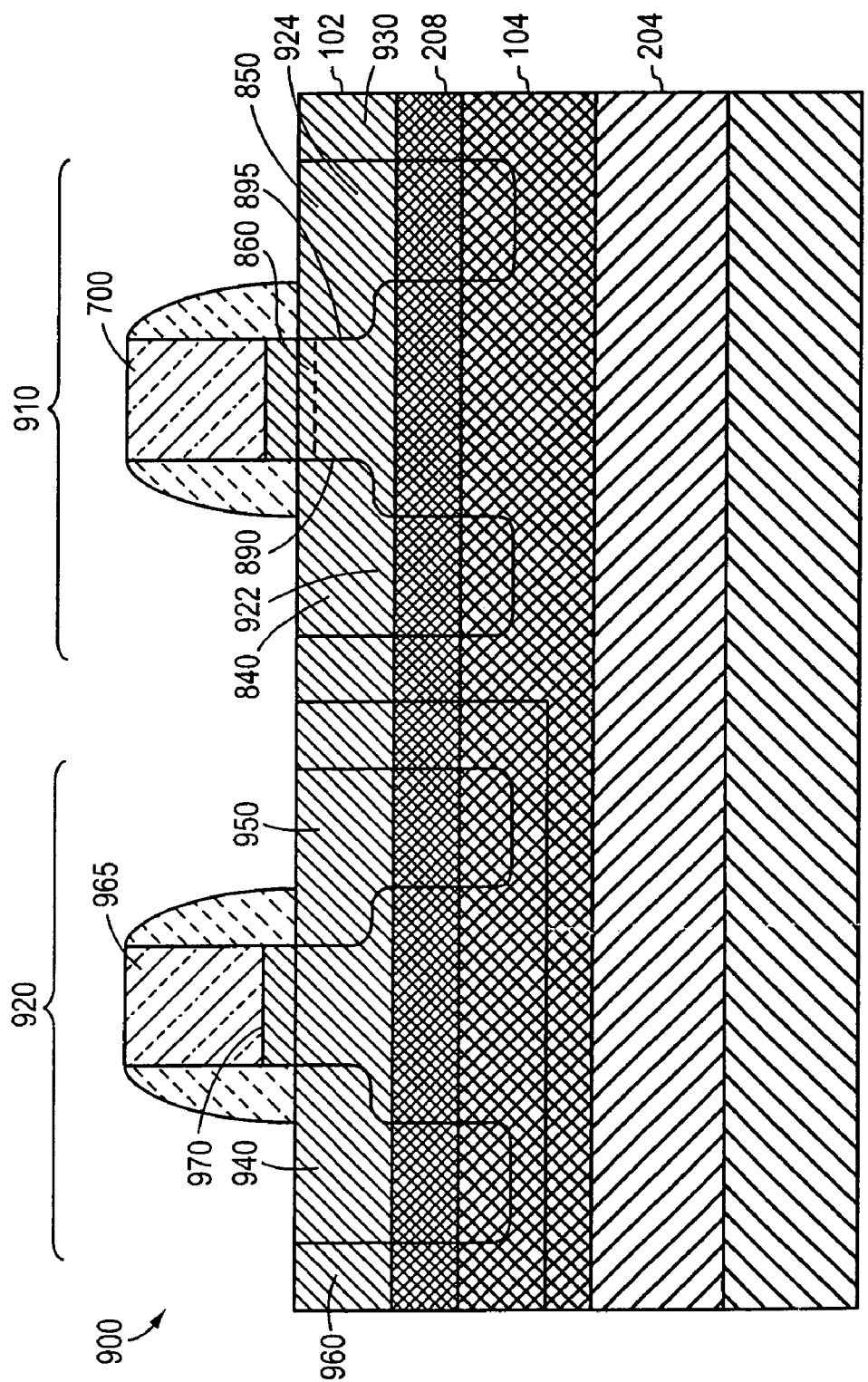
FIG. 9 is a schematic cross-sectional view of a semiconductor structure fabricated on the substrate.

Referring to FIG. 9, a first transistor 910 and a second transistor 920 may be formed over strained layer 102. At least a portion 922 of first source 840 and at least a portion 924 of first drain 850 may be disposed in a first portion 930 of the strained layer 102. First source 840 and first drain 924 may extend into compressively strained layer 208 and relaxed layer 104. First gate 700 may be disposed above strained layer 102 and between first source 840 and first drain 850. First gate 700 may include a metal, such as titanium, tungsten, molybdenum, tantalum, nickel, cobalt, or platinum. In some embodiments, gate 700 may contain a metal-semiconductor alloy, such as metal silicide, metal germanocide, or metal germanosilicide. In some embodiments, the gate 700 may include only a metal-semiconductor alloy. Channel 860 may be disposed under gate 700. Source 840 may include source extent 890 and drain 850 may include a drain extent 895. Each or both of the drain source extent 890 and drain extent 895 may extend under gate 700 a distance less than 12.5% of channel length $L_1$ (see FIG. 8A). A concentration of dopants in the source extent 890 and/or the drain extent 895 may be at least $10^{18}$ atoms/cubic centimeter.

The second transistor 920 may include a second source 940 and a second drain 950 disposed in a second portion 960 of the strained layer 102. A second gate 965 may be disposed above the strained layer 102 and between the second source 940 and second drain 950. The second gate 965 may include a second metal, such as titanium, tungsten, molybdenum, tantalum, nickel, cobalt, or platinum. In some embodiments, gate 965 may contain a metal-semiconductor alloy. In some embodiments, the gate 965 may include only a metal-semiconductor alloy. A second gate dielectric layer 970 may be disposed between the second gate 965 and the strained layer 102. The first transistor 910 may be an n-type metal-oxide semiconductor field-effect transistor (n-MOSFET), the first source 840 and the first drain 850 may include n-type dopants. The second transistor 920 may be a p-type metal-oxide-semiconductor field-effect transistor (p-MOSFET), and the second source 940 and second drain 950 may include p-type dopants. CMOS device 900, therefore, includes both n-MOSFET 910 and p-MOSFET 920.

In some embodiments, gates 700 and 965 may be formed from semiconductor layers or from metal-semiconductor alloys, such as silicides.

In a CMOS device, a single gate having a mid-band gap workfunction (approximately 4.4–4.6 eV) may be used for both NMOS and PMOS devices such as, for example, fully depleted semiconductor-on-insulator devices built on SSOI substrates. Alternatively, two different materials having workfunctions closer to the respective band edges, e.g., approximately 0.2–0.4 eV below the conduction band edge (~4 eV) or approximately 0–0.2 eV above the valence band edge (~5 eV), may be used for NMOS and PMOS devices, respectively, formed with strained semiconductors such as strained silicon. By using a gate material that provides an appropriate workfunction without doping, gate depletion effects are avoided because dopants are unnecessary. Further, adverse short channel effects due to dopant diffusion from source and drain extensions 800, 810 are also avoided by the elimination of high thermal budget activation steps.

In some embodiments, gate electrode layer 520 may be formed from a gate semiconductor material such as polycrystalline Si, Ge, or SiGe that is reacted with a subsequently deposited metal, e.g., nickel, cobalt, titanium, or platinum, either before or after the definition of gate 700. The gate semiconductor material may be deposited as a layer by CVD and may have a thickness of approximately 500–2000 Å, e.g., 1000 Å. The subsequently deposited metal may be deposited by, e.g., sputter deposition, and may have a thickness of, for example, 2–15 nm. The gate semiconductor material and the metal may be reacted in a reaction process such as a silicidation process that includes, e.g., rapid thermal processing at, for example, 10–120 seconds at 400–850° C. The reaction process can also include a second rapid thermal processing step after a wet chemical strip that removes any unreacted metal from the structure. In these embodiments, the reaction conditions and the thicknesses of the gate semiconductor material and the metal are selected such that the gate semiconductor material and the metal substantially completely react with each other to form a metal-semiconductor alloy, such as a metal silicide. Gate 700, thus, substantially comprises a silicide material such as nickel silicide, cobalt silicide, titanium silicide, or platinum silicide, or a germanocide material such as nickel germanocide, cobalt germanocide, titanium germanocide, or platinum germanocide. Gate electrode layer 520 may be doped by the introduction of a plurality of n-type or p-type dopants prior to the reaction process, e.g., the silicidation reaction. Such doping may alter the post-reaction process gate workfunction, facilitating the fabrication of devices with a desired threshold voltage. The reaction process may be performed before or after the definition of gate 700. Because the full reaction of the semiconductor gate electrode layer 520 (and hence gate 700) results in gate 700 being a metal gate, polysilicon depletion effects are eliminated.

Figure 10:
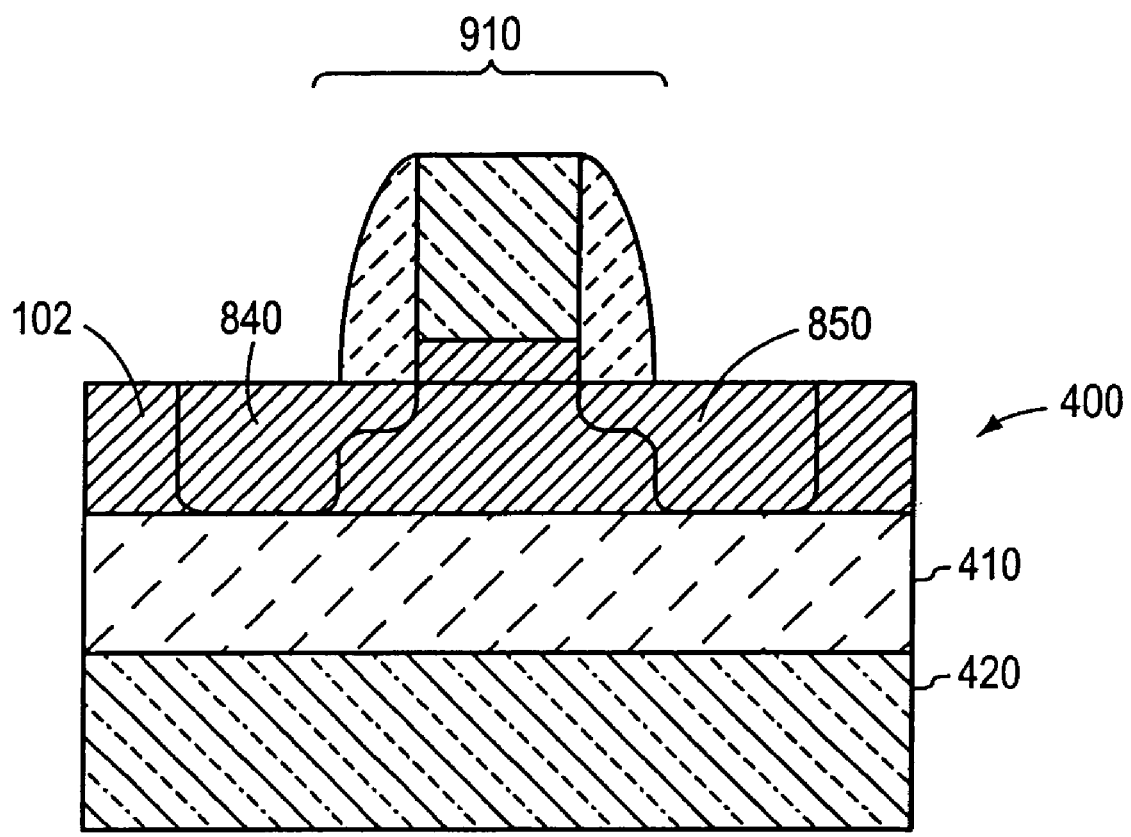
FIG. 10 is a schematic cross-sectional view of a semiconductor structure fabricated on another substrate.

Referring to FIG. 10 as well as to FIGS. 4 and 9, transistor 910 may be formed over SSOI substrate 410, in which strained layer 102 is disposed in contact with dielectric layer 410. In this embodiment, source 840 and drain 850 are disposed entirely within strained layer 102.

The methods and structures described above with reference to FIGS. 5–10 may be formed on other epitaxial wafers, such as the wafers illustrated in FIGS. 1 and 3.

The invention may be embodied in other specific forms without departing from the spirit or essential characteristics thereof. The foregoing embodiments are therefore to be considered in all respects illustrative rather than limiting on the invention described herein. Scope of invention is thus indicated by the appended claims rather than by the foregoing description, and all changes which come within the meaning and range of equivalency of the claims are intended to be embraced therein.

The invention claimed is:

1. A method for forming a structure, the method comprising:
   forming a gate of a transistor over a substrate, the gate defining a channel therebelow;
   introducing a plurality of dopants into the substrate proximate the channel to define a source and drain; and
   heating the substrate to a temperature for a time to activate the plurality of dopants,
   wherein the gate includes a depletion region having a thickness less than approximately 20 Angstroms, and at least one of the temperature and the time is sufficiently low so that diffusion of the plurality of dopants beyond the source and the drain is sufficiently low such that an off current of the transistor is low.

2. The method of claim 1, wherein the channel comprises a strained semiconductor.

3. The method of claim 1, wherein forming the gate comprises depositing a semiconductor layer over the substrate, forming a metal layer over the semiconductor layer, and heating the substrate such that at least a portion of the semiconductor layer reacts with the metal layer to form a metal-semiconductor alloy.

4. The method of claim 3, further comprising introducing a plurality of dopants into the gate.

5. The method of claim 3, wherein substantially all of the semiconductor layer reacts with the metal to form the metal-semiconductor alloy.

6. The method of claim 3, wherein the metal comprises Ni.

7. The method of claim 6, wherein the substrate is heated by at least one of flash annealing and laser annealing and the time is less than 1 second.

8. The method of claim 7, wherein the temperature is chosen from a range of 900° C. –1350° C.

9. The method of claim 1, wherein after heating the substrate, an abruptness of a dopant concentration in at least one of the source and the drain is greater than approximately 2 nanometers per decade.

10. The method of claim 9, wherein the abruptness is greater than approximately 4 nanometers per decade.

11. The method of claim 1, wherein the gate consists essentially of metal.

12. The method of claim 11, wherein the metal consists essentially of a single metallic element.

13. The method of claim 11, wherein the metal consists essentially of at least two metallic elements.

14. The method of claim 1, wherein at least one of the source and drain comprises an element other than Si.

15. The method of claim 14, wherein the element comprises Ge.

16. The method of claim 1, wherein at least one of the source and the drain comprises a strained semiconductor material.

17. The method of claim 16, wherein the strained semiconductor material is compressively strained.

18. The method of claim 1, wherein the strained semiconductor material comprises at least one of SiGe and Ge.

19. The method of claim 1, wherein the off current is less than $10^{-6}$ Amperes per micrometer.

20. The method of claim 19, wherein the off current is less than $10^{-9}$ Amperes per micrometer.

21. A structure comprising:
   a substrate;
   an n-type metal-oxide semiconductor field-effect transistor disposed over the substrate including:
      a first source and a first drain, defining a first channel therebetween and each of the first source and first drain comprising n-type dopants,
      a first gate disposed above the first channel, the first gate having a first workfunction and comprising a first metal, and
      a first gate dielectric layer disposed between the first gate and the first channel; and
   a p-type metal-oxide semiconductor field-effect transistor disposed over the substrate including:
      a second source and a second drain, defining a second channel therebetween and each of the second source and second drain comprising p-type dopants;
      a second gate disposed above the second channel, the second gate having a second workfunction and comprising a second metal; and
      a second gate dielectric layer disposed between the second gate and the second channel,
   wherein the first workfunction is substantially different from the second workfunction, and at least one of the first channel and the second channel comprises a strained semiconductor.

22. The structure of claim 21, wherein the first channel and the second channel each comprises a strained semiconductor.

23. The structure of claim 21, wherein at least one of the first metal and the second metal comprises at least one of molybdenum, titanium, tantalum, tungsten, iridium, cobalt, and platinum.

24. The structure of claim 21, wherein at least one of the first metal and the second metal comprises nickel.

25. The structure of claim 21, wherein at least one of the first gate and the second gate consists essentially of a metal-semiconductor alloy.

26. The structure of claim 21, wherein an abruptness of a dopant concentration in at least one of the first source, the first drain, the second source, and the second drain is greater than approximately 2 nanometers per decade.

27. The structure of claim 26, wherein the abruptness is greater than approximately 4 nanometers per decade.

28. The structure of claim 21, wherein at least one of the first source, the first drain, the second source, and the second drain comprises a second strained semiconductor.

29. The structure of claim 28, wherein the second strained semiconductor is compressively strained.

30. The structure of claim 28, wherein the second strained semiconductor comprises at least one of SiGe and Ge.

31. The structure of claim 21, wherein the strained semiconductor comprises tensilely strained Si.

* * * * *

(12) EX PARTE REEXAMINATION CERTIFICATE (6955th)
United States Patent
Lochtefeld et al.

(10) Number: US 7,074,655 C1
(45) Certificate Issued: *Jul. 21, 2009

(54) GATE MATERIAL FOR SEMICONDUCTOR DEVICE FABRICATION

(75) Inventors: Anthony J. Lochtefeld, Somerville, MA (US); Dimitri Antoniadis, Newton, MA (US); Matthew T. Currie, Brookline, MA (US)

(73) Assignee: Amberwave Systems Corporation, Salem, NH (US)

Reexamination Request:
No. 90/008,153, Aug. 4, 2006

Reexamination Certificate for:
Patent No.: 7,074,655
Issued: Jul. 11, 2006
Appl. No.: 11/237,175
Filed: Sep. 28, 2005

( * ) Notice: This patent is subject to a terminal disclaimer.

Related U.S. Application Data

(63) Continuation of application No. 10/691,007, filed on Oct. 22, 2003, now Pat. No. 6,991,972.
(60) Provisional application No. 60/420,227, filed on Oct. 22, 2002.

(51) Int. Cl.
*H01L 21/00* (2006.01)
*H01L 27/01* (2006.01)

(52) U.S. Cl. .................. 438/149; 438/198; 438/938; 438/150; 257/347; 257/350; 257/351; 257/E21.635; 257/E21.634; 257/E21.633; 257/E21.434; 257/E21.202; 257/E21.203; 257/E29.286; 257/E29.161; 257/E29.16; 257/E29.158; 257/E29.056

(58) Field of Classification Search .................. None
See application file for complete search history.

(56) References Cited

U.S. PATENT DOCUMENTS 6,475,908 B1 * 11/2002 Lin et al. ................. 438/659

6,555,453 B1 * 4/2003 Xiang et al. ............... 438/581
7,074,655 B2  7/2006 Lochtefeld et al.

FOREIGN PATENT DOCUMENTS

JP  P2000-243854 A  9/2000
WO  WO 01/54202 A1  7/2001

OTHER PUBLICATIONS

U.S. Appl. No. 60/265,089.*
Song, S. et al., "High Performance Transistors with State-of-the-Art CMOS Technologies," IEEE International Electron Devices Meeting (IEDM) Technical Digest, pp. 427–430, Dec. 1999.
Qin, M. et al., "Investigation of Polycrystalline Nickel Silicide Films as a Gate Material," Journal of the Electrochemical Society, 148 (5), pp. G271–G274, May 2001.
Gebel, T. et al., "Flash Lamp Annealing With Millisecond Pulses For Ultra–Shallow Boron Profiles in Silicon," Institute of Ion Beam Physics and Materials Research Annual Report 2001, pp. 29–31, contents available on–line, Oct. 12, 2001.
Yeo, Y. et al., "Dual–Metal Gate CMOS Technology with Ultrathin Silicon Nitride Gate Dielectric," IEEE Electron Device Letters, vol. 22, No. 5, pp. 227–229, May 2001.
Hock, et al., 0.1 μm T–Gate p–Type Ge/SiGe MODFETs, Silicon Monolithic Integrated Circuits in RF Systems, Digest of Papers, pp. 156–158, Apr. 2000.
Ghani T. et al., "Scaling Challenges and Device Design Requirements for High Performance Sub–50 nm Gate Length Planar CMOS Transistors," 2000 Symposium on VLSI Technology Digest or Technical Papers, pp. 174–175, Jun. 2000.
Wong, C. Y., et al. "Doping of N+ and P+ Polysilicon in a Dual–Gate CMOS Process," IEEE International Electron Devices meeting (IEDM) Technical Digest, International, pp. 238–241, Dec. 1988.

(Continued)

*Primary Examiner*—Erik Kielin

(57) ABSTRACT

In forming an electronic device, a semiconductor layer is pre-doped and a dopant distribution anneal is performed prior to gate definition. Alternatively, the gate is formed from a metal. Subsequently formed shallow sources and drains, therefore, are not affected by the gate annealing step.

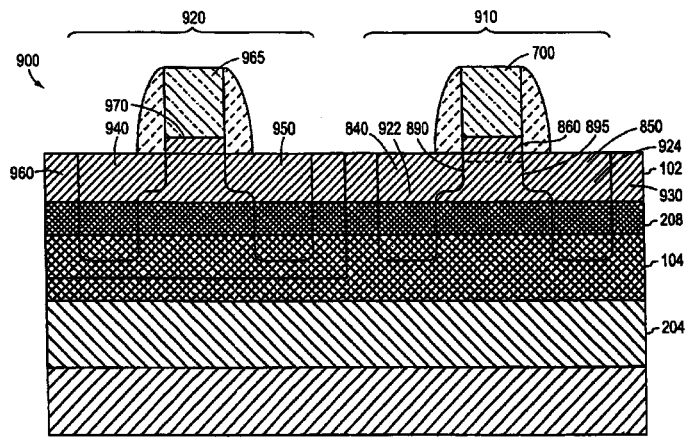

OTHER PUBLICATIONS

Swaroop, B., et al. "Conduction in Silicon mitride and Silicon Nitride–Oxide Films," J. Phys. D: Appl. Phys., 1970, vol. 3, pp. 803–806.

Wolf, S., et al. "Silicon Processing for the VLSI Era," vol. 1, pp. 397–399 (Lattice Press 1986).

* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 10, 27 and 28 are cancelled.

Claims 1, 18, 21, 22, 29 and 30 are determined to be patentable as amended.

Claims 2–9, 11–17, 19, 20, 23–26 and 31, dependent on an amended claim, are determined to be patentable.

New claims 32–47 are added and determined to be patentable.

1. A method for forming a structure, the method comprising:
   forming a gate of a transistor over a substrate, the gate defining a channel therebelow;
   introducing a plurality of dopants into the substrate proximate the channel to define a source and drain; and
   heating the substrate to a temperature for a time to activate the plurality of dopants,
   wherein the gate includes a depletion region having a thickness less than approximately 20 Angstroms, [and] at least one of the temperature and the time is sufficiently low so that diffusion of the plurality of dopants beyond the source and the drain is sufficiently low such that an off current of the transistor is low, *and, after heating the substrate, an abruptness of a dopant concentration in at least one of the source and the drain is greater than approximately 4 nanometers per decade.*

18. The method of claim [1] *17*, wherein the strained semiconductor material comprises at least one of SiGe and Ge.

21. A structure comprising:
    a substrate;
    an n-type metal-oxide semiconductor field-effect transistor disposed over the substrate including:
       a first source and a first drain, defining a first channel therebetween and each of the first source and first drain comprising n-type dopants,
       a first gate disposed above the first channel, the first gate having a first workfunction and comprising a first metal, and
       a first gate dielectric layer disposed between the first gate and the first channel; and
    a p-type metal-oxide semiconductor field-effect transistor disposed over the substrate including:
       a second source and a second drain, defining a second channel therebetween and each of the second source and second drain comprising p-type dopants[;],
       a second gate disposed above the second channel, the second gate having a second workfunction and comprising a second metal[;], *and*
       a second gate dielectric layer disposed between the second gate and the second channel,
    wherein the first workfunction is substantially different from the second workfunction, [and at least one of the first channel and] the second channel comprises a strained semiconductor, *and at least one of the second source and the second drain comprises a second strained semiconductor different from the strained semiconductor.*

22. The structure of claim 21, wherein the first channel and the second channel each comprises [a] *the* strained semiconductor.

29. The structure of claim [28] *21*, wherein the second strained semiconductor is compressively strained.

30. The structure of claim [28] *21*, wherein the second strained semiconductor comprises at least one of SiGe and Ge.

*32. The method of claim 1, wherein the thickness of the depletion region is less than 10 Angstroms.*

*33. The structure of claim 21, wherein the first channel and the second channel each comprise Si.*

*34. The structure of claim 33, wherein the first channel and the second channel each consist of Si or Si doped with at least one of n-type and p-type dopants.*

*35. The structure of claim 34, wherein the first channel and the second channel each consist of strained Si or strained Si doped with at least one of n-type and p-type dopants.*

*36. The structure of claim 29, wherein the first channel and the second channel each consist of Si or Si doped with at least one of n-type and p-type dopants.*

*37. The structure of claim 30, wherein the first channel and the second channel each consist of Si or Si doped with at least one of n-type and p-type dopants.*

*38. A method for forming a structure, the method comprising:*
   *forming a gate of a transistor over a substrate, the gate defining a channel therebelow, forming the gate comprising:*
      *depositing a semiconductor layer over the substrate;*
      *forming a metal layer over the semiconductor layer, and*
      *heating the substrate such that only a portion of the semiconductor layer reacts with the metal layer to form a metal-semiconductor alloy;*
   *introducing a plurality of dopants into the substrate proximate the channel to define a source and a drain; and*
   *heating the substrate to a temperature for a time to activate the plurality of dopants,*
   *wherein the gate includes a depletion region having a thickness less than approximately 20 Angstroms, and at least one of the temperature and the time is sufficiently low so that diffusion of the plurality of dopants beyond the source and the drain is sufficiently low such that an off current of the transistor is low.*

*39. The method of claim 38, wherein forming the gate further comprises:*
   *implanting a plurality of dopants into the semiconductor layer; and*
   *thereafter, removing at least a portion of the semiconductor layer.*

*40. The method of claim 38, wherein the metal comprises Ni.*

*41. The method of claim 40, wherein the channel comprises a strained semiconductor.*

*42. The method of claim 41, wherein the channel consists of strained Si or strained Si doped with at least one of n-type and p-type dopants.*

43. The method of claim 42, wherein after heating the substrate, an abruptness of a dopant concentration in at least one of the source and the drain is greater than approximately 2 nanometers per decade.

44. The method of claim 42, wherein at least one of the source and the drain comprises a compressively strained semiconductor material.

45. The method of claim 44, wherein the compressively strained semiconductor material comprises at least one of SiGe and Ge.

46. A structure comprising:

a substrate;

an n-type metal-oxide semiconductor field-effect transistor disposed over the substrate including:
- a first source and a first drain, defining a first channel therebetween and each of the first source and first drain comprising n-type dopants,
- a first gate disposed above the first channel, the first gate having a first workfunction and comprising a first metal, and
- a first gate dielectric layer disposed between the first gate and the first channel; and a p-type metal-oxide semiconductor field-effect transistor disposed over the substrate including:
- a second source and a second drain, defining a second channel therebetween and each of the second source and second drain comprising p-type dopants,
- a second gate disposed above the second channel, the second gate having a second workfunction and comprising a second metal, and
- a second gate dielectric layer disposed between the second gate and the second channel, wherein the first workfunction is substantially different from the second workfunction, and the first channel and the second channel each comprise a strained semiconductor.

47. A structure comprising:

a substrate;

an n-type metal-oxide semiconductor field-effect transistor disposed over the substrate including:
- a first source and a first drain, defining a first channel therebetween and each of the first source and first drain comprising n-type dopants,
- a first gate disposed above the first channel, the first gate having a first workfunction and comprising a first metal, and
- a first gate dielectric layer disposed between the first gate and the first channel; and a p-type metal-oxide semiconductor field-effect transistor disposed over the substrate including:
- a second source and a second drain, defining a second channel therebetween and each of the second source and second drain comprising p-type dopants,
- a second gate disposed above the second channel, the second gate having a second workfunction and comprising a second metal, and
- a second gate dielectric layer disposed between the second gate and the second channel, wherein the first workfunction is substantially different from the second workfunction, at least one of the first channel and the second channel comprises a strained semiconductor, and an abruptness of a dopant concentration in at least one of the first source, the first drain, the second source, and the second drain is greater than approximately 2 nanometers per decade.

* * * * *